(12) United States Patent
Hwang

(10) Patent No.: US 8,057,648 B2
(45) Date of Patent: Nov. 15, 2011

(54) DEPOSITION SYSTEM USING NOISE CANCELLER AND ITS METHOD OF CONTROL

(75) Inventor: Min-Jeong Hwang, Kyunggi-do (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1672 days.

(21) Appl. No.: 11/324,344

(22) Filed: Jan. 4, 2006

(65) Prior Publication Data

US 2006/0147646 A1   Jul. 6, 2006

(30) Foreign Application Priority Data

Jan. 6, 2005   (KR) .................. 10-2005-0001086
Jan. 6, 2005   (KR) .................. 10-2005-0001087
Jan. 6, 2005   (KR) .................. 10-2005-0001088

(51) Int. Cl.
*C23C 14/52* (2006.01)
(52) U.S. Cl. .......... 204/298.03; 204/298.08; 204/192.13
(58) Field of Classification Search ............ 204/298.03, 204/298.08, 192.16
See application file for complete search history.

(56) References Cited

U.S. PATENT DOCUMENTS

| | | | |
|---|---|---|---|
| 3,553,606 A * | 1/1971 | Port .......................... | 333/18 |
| 5,880,823 A * | 3/1999 | Lu ............................ | 356/72 |
| 6,106,676 A * | 8/2000 | Terry et al. ............... | 204/192.13 |
| 6,695,954 B2 | 2/2004 | Hong | |
| 6,914,016 B2 | 7/2005 | Tan et al. | |

FOREIGN PATENT DOCUMENTS

| | | |
|---|---|---|
| GB | 964646 | 7/1964 |
| JP | 06-168005 | 6/1994 |
| JP | 07-261805 | 10/1995 |
| JP | 2002-038656 | 2/2000 |
| JP | 2003-224108 | 8/2003 |
| KR | 10-2000-0025932 | 5/2000 |
| TW | 507016 | 10/2002 |

OTHER PUBLICATIONS

*Office action* from the Korean Intellectual Property Office issued in Applicant's corresponding Korean Patent Application No. 10-2005-0001088 dated Jul. 25, 2006.
Korean Office Action of the Korean Patent Application No. 10-2005-0001086, issued on Mar. 28, 2006.
Search Report from the Taiwan intellectual Property Office issued in Applicant's corresponding Taiwanese Patent Application No. 95100443 dated Feb. 7, 2009.

* cited by examiner

*Primary Examiner* — Keith Hendricks
*Assistant Examiner* — Jason M Berman
(74) *Attorney, Agent, or Firm* — Robert E. Bushnell, Esq.

(57) ABSTRACT

A deposition system and its method of control cancels the influence of noise occurring during measuring of a deposition rate using a noise canceller in order to exactly control the deposition rate, and obtains a film of a desired thickness. The deposition system includes a deposition device. A deposition rate sensor measures a deposition rate of the deposition device. A noise canceller cancels a noise component of the measured deposition rate. A power supply unit adjusts power supplied to the deposition device according to an output of the noise canceller.

20 Claims, 4 Drawing Sheets

DEPOSITION SYSTEM USING NOISE CANCELLER AND ITS METHOD OF CONTROL

CLAIM OF PRIORITY

This application makes reference to, incorporates the same herein, and claims all benefits accruing under 35 U.S.C.§119 from three applications earlier filed in the Korean Intellectual Property Office on 6 Jan. 2005 and there duly assigned Serial No. 10-2005-0001086, No. 10-2005-0001087, and No. 10-2005-0001088 respectively.

BACKGROUND OF THE INVENTION

1. Field of the Invention

The present invention relates to a deposition system and its method of control, and more particularly, to a deposition system, which cancels the influence of noise occurring during the measuring of a deposition rate using a noise canceller in order to exactly control the deposition rate, and a method of controlling the deposition system.

2. Description of the Related Art

A deposition system includes a deposition device, a deposition rate sensor, and a power supply unit. The deposition device includes an evaporator and a sputter. The deposition rate sensor measures a deposition rate of the deposition device. The power supply unit adjusts the power supplied to the deposition device according to the deposition rate of the deposition device measured by the deposition rate sensor. A crystal sensor measuring a deposition rate, using a crystal whose frequency is inversely proportional to a weight, is used as the deposition rate sensor. The deposition rate measured by the deposition rate sensor contains noise due to an electrical wave, noise due to power lines, noise due to vibration from a flow of cooling water, and noise due to a movement of a deposition source. Accordingly, when the deposition rate measured by the deposition rate sensor is provided to the power supply unit, the deposition rate is changed due to the noise. This leads to a formation of a film having an undesired thickness.

SUMMARY OF THE INVENTION

Accordingly, it is an aspect of the present invention to provide a deposition system, which cancels the influence of noise occurring during the measuring of a deposition rate using a noise canceller in order to exactly control the deposition rate, and which thereby obtains a film of a desired thickness, and a method of controlling the deposition system.

The foregoing and/or other aspects of the present invention are achieved by providing a deposition system including: a deposition device; a deposition rate sensor adapted to measure a deposition rate of the deposition device; a noise canceller adapted to cancel a noise component of the measured deposition rate; and a power supply unit adapted to adjust power supplied to the deposition device according to an output of the noise canceller.

According to a second aspect of the present invention, a deposition system is provided including: a deposition device; a power supply unit adapted to supply power to the deposition device; a deposition rate sensor adapted to measure a deposition rate of the deposition device; and a noise canceller adapted to control the power supply unit to change the power supplied to the deposition device according to a range of the measured deposition rate upon a deposition rate during a measuring time period and a deposition rate during a time period of the measuring time period equal to or greater than a predetermined percentage being in the same range.

According to a third aspect of the present invention, a method of controlling a deposition system is provided, the method including: (a) measuring a deposition rate of a deposition device; (b) determining whether a deposition rate during a measuring time period and a deposition rate during a time period of the measuring time period greater than a predetermined percentage are in the same range; (c) changing the power supplied to the deposition device according to a range of the measured deposition rate upon the deposition rate during a measuring time period and the deposition rate during a time period of the measuring time period greater than a predetermined percentage being in the same range; and (d) repeating steps (a) to (d).

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
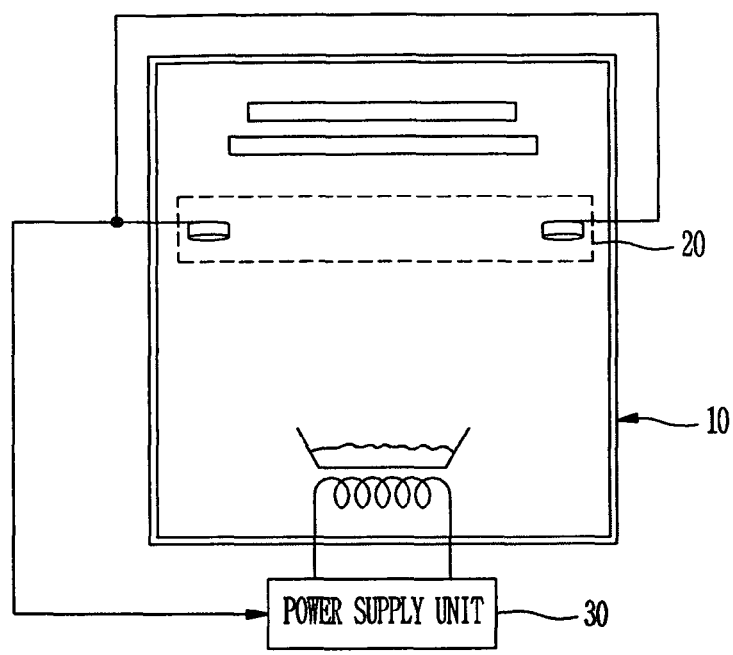
FIG. 1 is a view of a deposition system.

FIG. 1 is a view of a deposition system. With reference to FIG. 1, the deposition system includes a deposition device 10, a deposition rate sensor 20, and a power supply unit 30. The deposition device 10 includes an evaporator and a sputter. The deposition rate sensor 20 measures a deposition rate of the deposition device 10. The power supply unit 30 adjusts the power supplied to the deposition device according to the deposition rate of the deposition device 10 measured by the deposition rate sensor 20. A crystal sensor measures a deposition rate, using a crystal whose frequency is inversely proportional to an applied weight, is used as the deposition rate sensor 20. The deposition rate measured by the deposition rate sensor 20 contains noise due to electrical wave, noise due to power lines, noise due to vibration from a flow of cooling water, and noise due to a movement of a deposition source. Accordingly, when the deposition rate measured by the deposition rate sensor 20 is provided to the power supply unit 30, the deposition rate is changed due the noise. This leads to a formation of a film having an undesired thickness.

Figure 2:
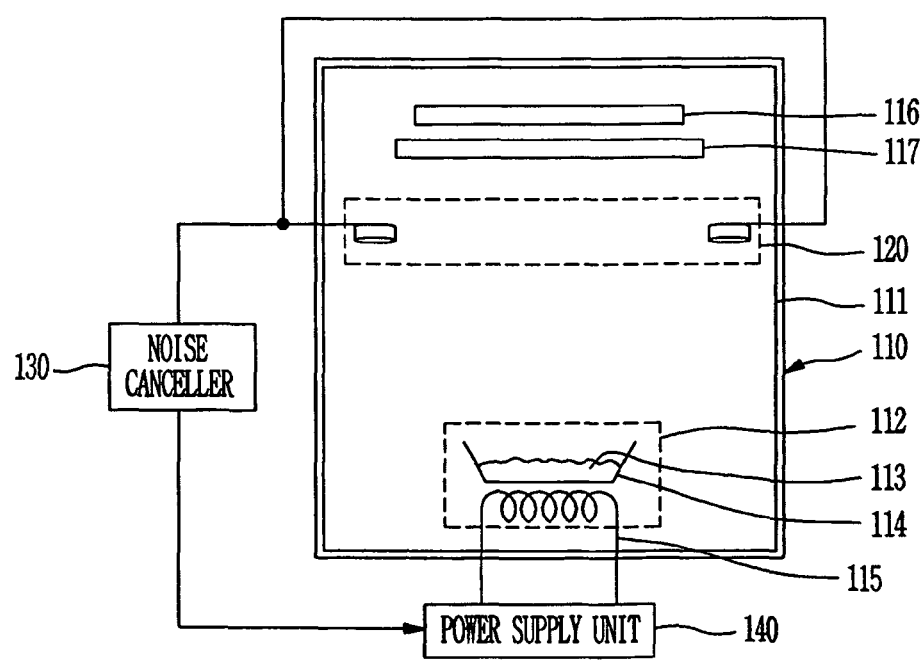
FIG. 2 is a view of a deposition system according to an embodiment of the present invention.

FIG. 2 is a view of a deposition system according to an embodiment of the present invention. Referring to FIG. 2, the deposition system according to an embodiment of the present invention includes a deposition device 110, a deposition rate sensor 120, a noise canceller 130, and a power supply unit 140.

Although an evaporator or a sputter can be used as the deposition device 10, the evaporator is used in this embodiment of the present invention. The deposition device 110 includes a vacuum chamber 111 and a deposition source 112. The vacuum chamber 111 maintains a vacuum state therein. A deposition rate of the deposition source 112 is controlled according to the power supplied to the power supply unit 140. The deposition source 112 includes a deposition material 113, a boat 114, and a coil 115. The deposition material 113 evaporates at a high temperature. The deposition material 113 is loaded on the boat 114. The coil 115 is connected to the power supply unit 140 and applies heat to the boat 114. The deposition device 110 operates in a state that a substrate 116 is disposed therein, or the substrate 116 and a mask 117 are disposed therein, thereby depositing the deposition material 113 of a desired thickness on the substrate 116.

Furthermore, in one embodiment, although a crystal sensor can be used as the deposition rate sensor 120, the present invention is not limited thereto.

A crystal sensor measures a deposition rate, using a crystal whose frequency is inversely proportional to an applied weight, is used as the deposition rate sensor 120. Using a principle in which a frequency reduces when the weight applied to the crystal is increased by a deposition, the deposition rate sensor 120 measures an increase in the rate of the applied weight, namely, a deposition rate based on the weight.

Moreover, the noise canceller 130 performs a function of canceling a noise component of a deposition rate outputted from the deposition rate sensor 120.

A Low Pass Filter (referred to as 'LPF' hereinafter) can be used as the noise canceller 130. The LPF performs a function of canceling or reducing noise from the deposition rate sensor 120, namely, a high frequency component outputted from the deposition rate sensor 120, and then providing the result to the power supply unit 140. This is only one embodiment, but the noise canceller 130 is not limited thereto.

The description below of a deposition system according to an embodiment of the present invention assumes that the noise canceller 130 is embodied by the LPF.

The LPF 130 can be embodied by an analog circuit or a digital circuit. Also, the LPF 130 can be embodied by a processor in which an LPF program is executed.

An RC circuit having a resistor and a capacitor is an example of an analog circuit. A Finite Impulse Response (referred to as 'FIR' hereinafter) filter or an Infinite Impulse Response (referred to as 'IIR' hereinafter) filter can be used as the digital circuit.

When the LPF 130 is embodied by a processor, the LPF 130 can be programmed to perform the same operation as that of a processor FIR filter or the IIR filter.

Figure 3:
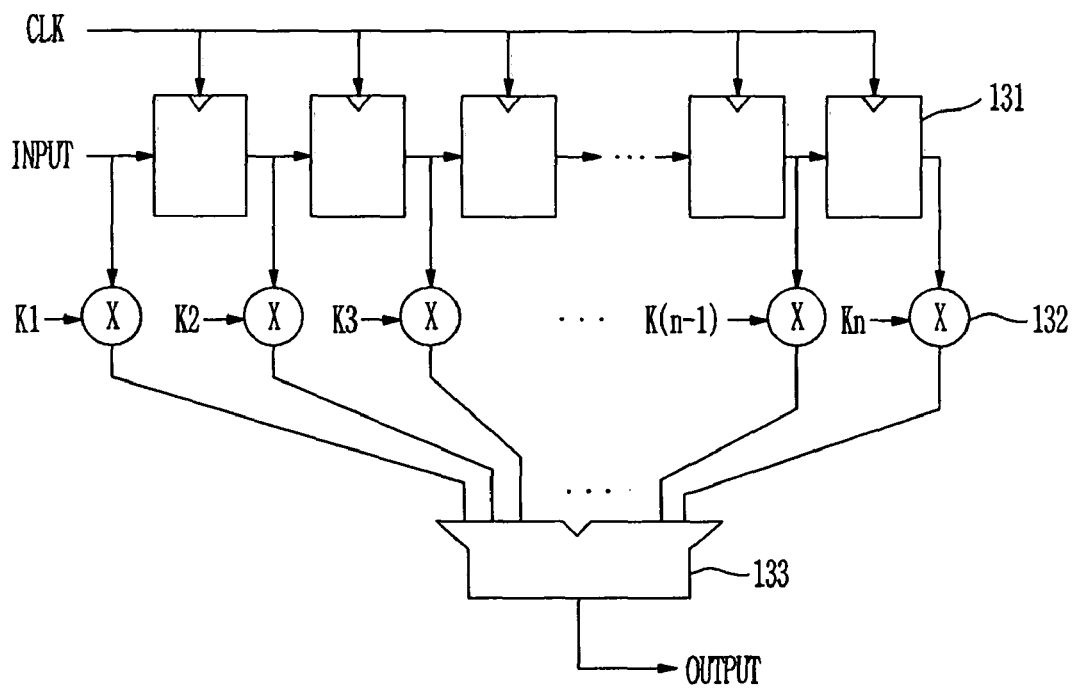
FIG. 3 is a view of an FIR filter that is an example of the noise canceller included in the deposition system of FIG. 2.

FIG. 3 is a view of an FIR filter that is an example of the noise canceller included in the deposition system of FIG. 2.

Referring to FIG. 3, an LPF 130 includes a plurality of registers 131, a plurality of multipliers 132, and an adder 133.

The plurality of registers 131 sequentially shift a deposition rate INPUT from a deposition rate sensor 120.

The plurality of multipliers 132 multiply and output outputs of the plurality of registers 131 and filter coefficients K1 to Kn. Each of the filter coefficients K1 to Kn has a predetermined value. When all of the filter coefficients K1 to Kn are one, the LPF 130 does not include the multipliers 132. The outputs of the plurality of registers 131 are directly transferred to the adder 133.

The adder 133 performs a function of summing outputs of the plurality of multipliers 132. The number of deposition rate values inputted to the adder 133 determines an averaging window and bandwidth. When an input time period of the deposition rate is 0.1 second, and the number of deposition rate values is 10, a multiplication of the time period and the number of the averaging window becomes 1 second. As the number of deposition rate values inputted to the adder 133 is increased, the bandwidth of the LPF 130 is reduced. In contrast to this, as the number of deposition rate values is reduced, the bandwidth of the LPF 130 is increased. The adder 133 can be composed of a combination of a full adder, a combination of a half adder, or a combination of a full adder and a half adder.

Figure 4:
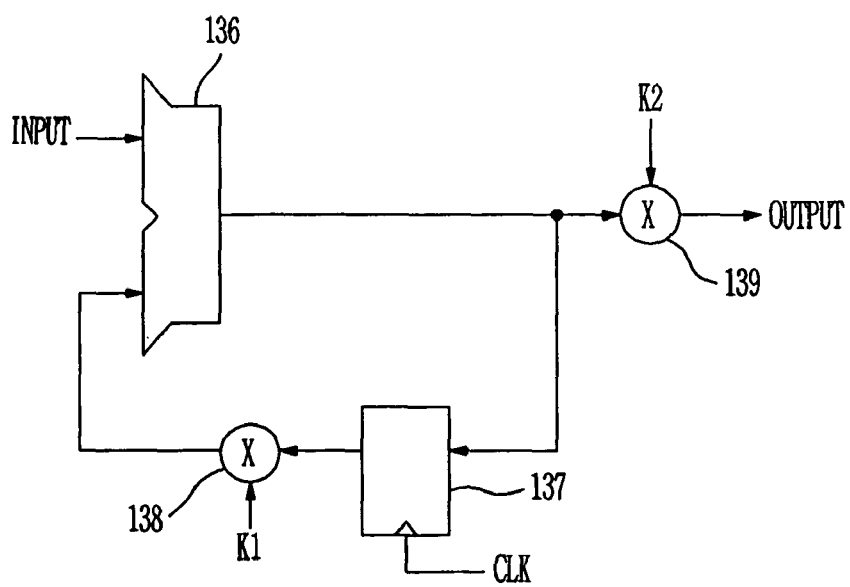
FIG. 4 is a view of an IIR filter that is another example of the noise canceller included in the deposition system of FIG. 2.

FIG. 4 is a view of an IIR filter that is another example of the noise canceller included in the deposition system of FIG. 2.

With reference to FIG. 4, the LPF 130 includes an adder 136, a register 137, a first multiplier 138, and a second multiplier 139.

The adder 136 carries out a function of summing the deposition rate INPUT transferred from the deposition rate sensor 120 and an output of the first multiplier 138, which is a feedback component. The register 137 operates in response to a clock signal CLK, and delays and transfers an output of the adder 13 to the first multiplier 138. The first multiplier 138 multiplies and outputs an output of the register 137 by a first coefficient K1. The first coefficient K1 has a value from zero to one. As the first coefficient K1 approaches zero, the bandwidth of the LPF 130 is reduced. In contrast to this, when the first coefficient K1 approaches one, the bandwidth of the LPF 130 is increased. The second multiplier 139 multiplies and outputs an output of the adder 136 by a second coefficient K2. The second coefficient K2 can be (1-the first coefficient). When the second coefficient K2 is one, the second multiplier can be omitted.

As described above, the LPF 130 included in the deposition system of the present invention first sets a wide bandwidth, and then reduces the bandwidth.

If the bandwidth is set small from an initial stage, the LPF 130 has an advantage in that it is less affected by noise. However, in this case, the LPF 130 has a problem in that it takes a long time to be converged.

If the bandwidth is increased, the time taken to be converged is reduced. However, the LPF 130 is greatly affected by noise.

Accordingly, in an embodiment of the present invention, the bandwidth of the LPF 130 is set wide at an initial stage, and then is reduced. This causes the influence due to the noise to be reduced, and the time taken until a convergence to also be reduced.

The power supply unit 140 adjusts the power supplied to the deposition device 110 according to an output of the LPF 130. When the output of the LPF 130, namely, a measuring deposition rate from which noise is cancelled, is greater than a target deposition rate, the power supply unit 140 reduces the power supplied to the deposition device 1 10. In contrast to this, when the output of the LPF 130, namely, the measuring deposition rate from which the noise is cancelled, is less than the target deposition rate, the power supply unit 140 increases the power supplied to the deposition device 110.

The deposition system of FIG. 2 operates in the aforementioned manner and reduces the influence of noise occurring in the deposition rate sensor 120, which allows a deposition rate to be exactly controlled.

Figure 5:
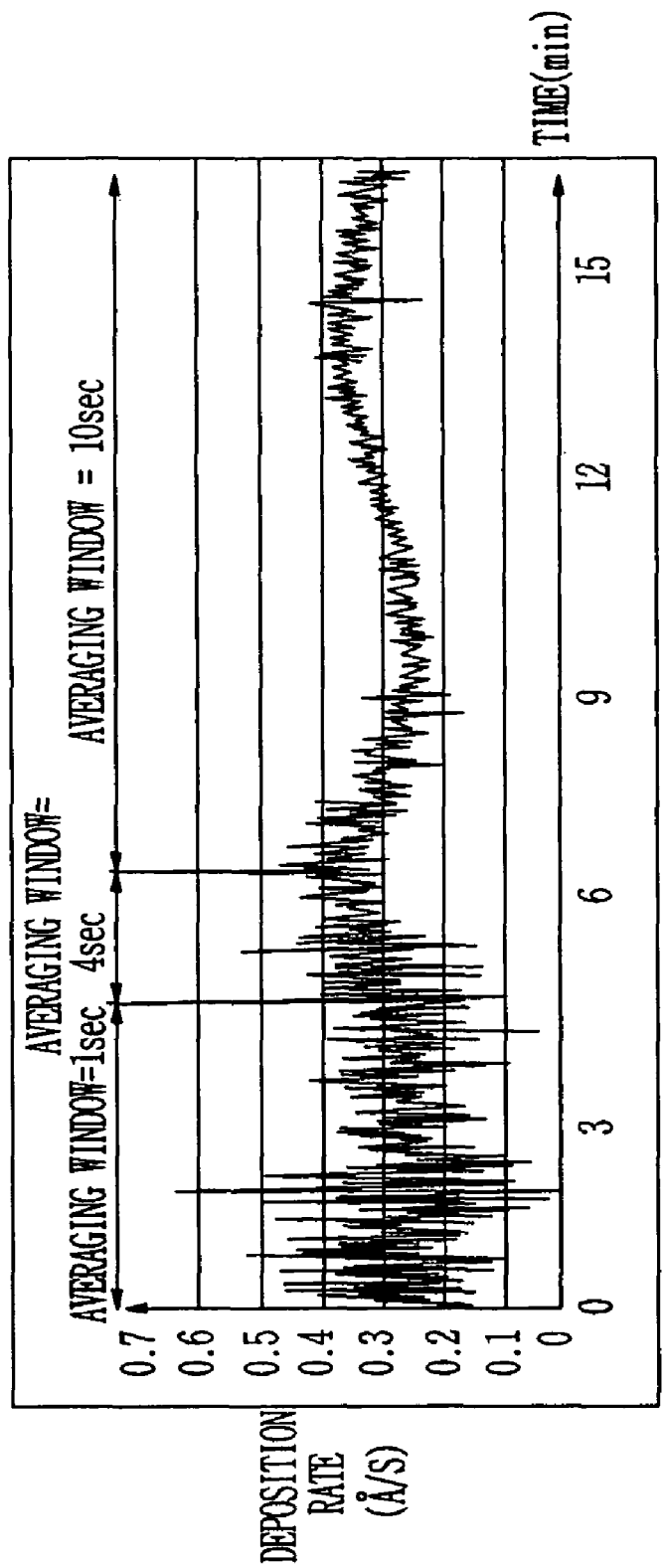
FIG. 5 is a view of a change of an output of the noise canceller included in the deposition system of FIG. 2 according during a passage of a time when a bandwidth of the noise canceller is gradually reduced.

FIG. 5 is a view of a change of an output of the noise canceller included in the deposition system of FIG. 2 during a passage of time when the bandwidth of the noise canceller is gradually reduced.

In FIG. 5, a longitudinal axis represents a time, and a transverse axis represents a deposition rate after passing through the LPF. In FIG. 5, a value of an averaging window is first set to 1 second. Next, the value of the average window is sequentially changed to 4 seconds and 10 seconds. As a result, FIG. 5 shows values obtained by measuring a deposition rate while gradually reducing the bandwidth. As shown in FIG. 5, it is noted that an influence due to a noise is reduced as time goes by.

When a deposition rate outputted from the deposition rate sensor 120 continues to maintain the same range during a predetermined measuring time period, the noise canceller 130 included in the deposition system of the present invention determines that noise is not included in the deposition rate. Then, the noise canceller 130 transfers the deposition rate to the power supply unit 140, thereby controlling the power supplied to the deposition device 110.

In contrast to this, when the deposition rate outputted from the deposition rate sensor 120 continues to maintain a different range during a predetermined measuring time period, the noise canceller 130 included in the deposition system of the present invention determines that noise is included in the deposition rate. The noise canceller 130 then cancels the noise included in the deposition rate to obtain compensated deposition rate information. The noise canceller 130 transfers the compensated deposition rate information to the power supply unit 140, thereby controlling the power supplied to the deposition device 110.

When noise is included in the deposition rate, the deposition rate is disregarded and the power supply unit 140 can maintain a power level from a previous state.

For example, when the deposition rate outputted from the deposition rate sensor 120 is continuously greater than a target deposition rate during a measuring time period by the noise canceller 130, the noise canceller 130 determines that noise is not included in the deposition rate, and the power supply unit 140 is controlled to reduce the power supplied to the deposition device 110.

Moreover, when the deposition rate outputted from the deposition rate sensor 120 is greater than the target deposition rate during a part time period of the measuring time period but is less than the target deposition rate during a remaining time period, the noise canceller 130 determines that noise is included in the deposition rate, and it cancels the noise from the deposition rate, and transfers compensated deposition rate information to the power supply unit 140, thereby controlling the power supplied to the deposition device 110.

That is, a deposition rate before the correction outputted from the deposition rate sensor 120 is disregarded, so that the deposition rate does not control the power supply unit 140.

When noise is included in the deposition rate, the deposition rate is disregarded, whereby the power supply unit 140 can maintain a power of a previous state.

In addition, when the deposition rate is in the same range during a predetermined time period of the measuring time period, the noise canceller 130 determines that noise is not included in the deposition rate and accordingly controls the power supply unit 140. In contrast to this, when the deposition rate is in a different range during a predetermined time period of the measuring time period, the noise canceller 130 determines that the noise is included in the deposition rate and cancels the noise included in the deposition rate to obtain compensated deposition rate information. The noise canceller 130 transfers the compensated deposition rate information to the power supply unit 140, thereby controlling the power supplied to the deposition device 110.

For example, when the deposition rate outputted from the deposition rate sensor 120 is continuously greater than a time period equal to or more than 70% of the measuring time period by the noise canceller 130, it is determined that noise is not included in the deposition rate. Accordingly, the noise canceller 130 controls the power supply unit 140 to reduce the power supplied to the deposition device 110.

In contrast to this, when the deposition rate outputted from the deposition rate sensor 120 is continuously greater or less than a time period less than 70% of the measuring time period by the noise canceller 130, and the deposition rate is continuously less or greater than a remaining time period, it is determined that noise is included in the deposition rate. Accordingly, the noise canceller 130 cancels the noise included in the deposition rate and transfers compensated deposition rate information to the power supply unit 140, thererby controlling the power supplied to the deposition device 110.

Namely, a deposition rate before the correction outputted from the deposition rate sensor 120 is disregarded, so that the deposition rate does not control the power supply unit 140.

When it is determined that noise is included in the deposition rate, the deposition rate is disregarded, whereby the power supply unit 140 can maintain the power in a previous state.

Preferably, the measuring time period is equal to or greater than one second.

The reason is that a length of experimentally measured noise does not exceed one second. When the measuring time period is set to be less than one second, the deposition rate can have a constant range during the measuring time period due to noise. Accordingly, in this case, this causes the noise to control the power supply unit 140.

Namely, so as to solve the above problem, the measuring time period is suitably greater than one second, which is longer than the length of the noise.

Moreover, the measuring time period is set to be shorter at an initial stage in the noise canceller 130 to increase a convergence speed. Thereafter, the measuring time period is set to be gradually longer to further reduce the influence due to the noise.

This was described previous to this by a case where the noise canceller 130 is embodied by an LPF.

Moreover, the power supply unit 140 performs a function of adjusting the power supplied to the deposition device 1 10 according to an output of the noise canceller 130. Where the output of the noise canceller 130 indicates that the deposition rate is higher than a target deposition rate, the power supply unit 140 reduces the power supplied to the deposition device 110. In contrast to this, when the output of the noise canceller 130 indicates that the deposition rate is lower than the target deposition rate, the power supply unit 140 increases the power supplied to the deposition device 110.

If the output of the noise canceller 130 indicates disregarding a measured deposition rate, the power supply unit 140 can maintain power in a previous state.

Also, the power supply unit 140 first sets a change unit of a supply power larger according to a power increase and reduction request to increase a convergence speed. Thereafter, the power supply unit 140 gradually sets the change unit of the supply power smaller to further reduce the influence of the noise.

The deposition system of FIG. 2 operates in the above-mentioned manner to reduce the influence of noise occurring in the deposition rate sensor 120, which allows the deposition rate to be exactly controlled.

In addition, by gradually increasing the measuring time period of the noise canceller 130 or gradually reducing the power change unit, the convergence speed is increased and the influence due to the noise is reduced.

Figure 6:
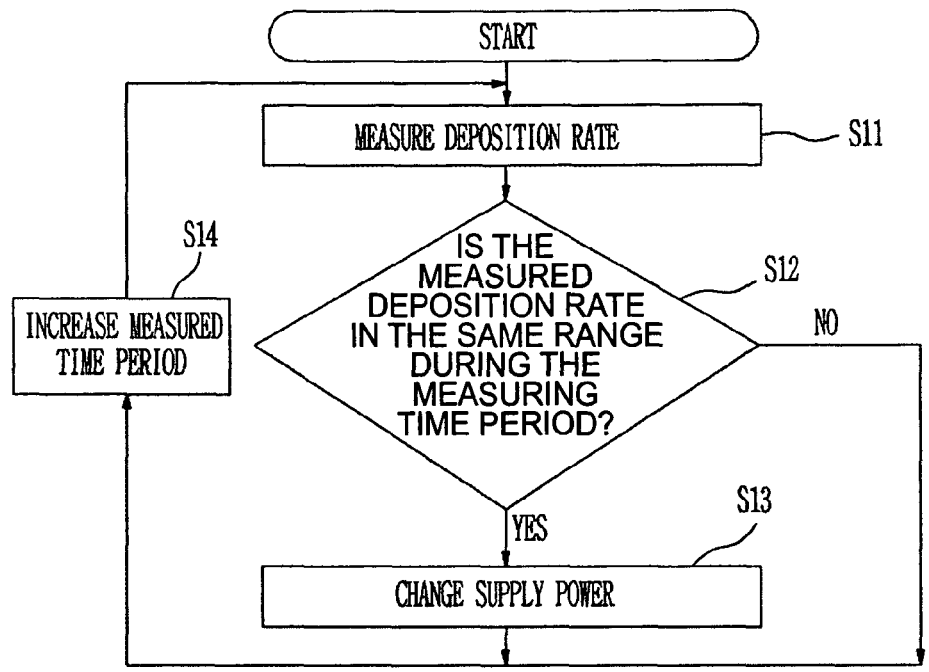
FIG. 6 is a flowchart of a method of controlling a deposition system according to an embodiment of the present invention.

FIG. 6 is a flowchart of a method of controlling a deposition system according to an embodiment of the present invention.

Referring to FIG. 6, a method of controlling a deposition system includes the steps of (S11) measuring a deposition rate; (S12) determining whether or not the measured deposition rate is in the same range during a measuring time period; (S13) changing a supply power; and (S14) increasing the measuring time period.

Step S11 measures a deposition rate of a deposition device during the measuring time period.

A determination is made as to whether or not the measured deposition rate is in the same range during a measuring time period (step S12). If the measured deposition rate is in the same range during the measuring time period, the supply power is changed according to a range of the measured deposition rate (step S13). If the measured deposition rate is in a different range during the measuring time period, the measured deposition rate is disregarded and the supply power is maintained at a previous value. In step S12, a determination is made as to whether or not the measured deposition rate is in the same range during a time period of the measuring time period greater than a predetermined percentage.

When the measured deposition rate is in the same range during a time period of the measuring time period greater than a predetermined percentage, the supply power is changed according to a range of the measured deposition rate (step SI3). In contrast to this, when the measured deposition rate is in a different range during a time period of the measuring time period greater than a predetermined percentage, the measured deposition rate is disregarded and the supply power is maintained at a previous value.

In step S13, the power supplied to the deposition device is changed according to a range of the deposition rate.

For example, it is assumed that the measured deposition rate is divided into two ranges having a first range and a second range of the measuring time period. The first range indicates a case where the measured deposition rate is greater than a target deposition rate, and the second range indicates a case where the measured deposition rate is less than the target deposition rate. When the measured deposition rate is in the first range of the measuring time period, the supply power to the deposition device is reduced. When the measured deposition rate is in the second range of the measuring time period, the supply power to the deposition device is increased.

Step S14 increases the measuring time period. Step S14 is not performed every loop, but is carried out after a predetermined passage of time, namely, after the loop repeats a predetermined number of times.

Step S14 can be performed only once. Step S14 can also be performed twice in such a way that step S14 is performed once more after a predetermined period of time has elapsed. A method of controlling a deposition system while maintaining the measuring time period at a constant value can omit step S14.

Figure 7:
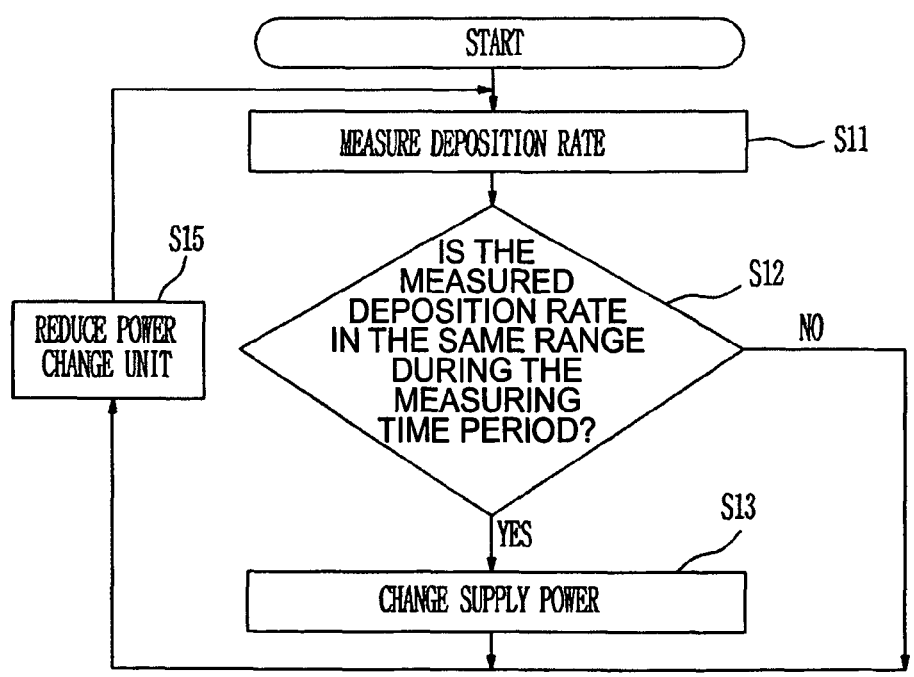
FIG. 7 is a flowchart of a method of controlling a deposition system according to another embodiment of the present invention.

FIG. 7 is a flowchart of a method of controlling a deposition system according to another embodiment of the present invention.

Steps S11, S12, and S13 of a method of controlling a deposition system of FIG. 7 are the same as those of the method of controlling a deposition system of FIG. 6.

Step 15 reduces a power change unit. Step S15 is not performed every loop, but is carried out after a predetermined period of time has elapsed, namely, after the loop repeats a predetermined number of times. Step S15 can be performed only once. Step S15 can also be performed at least twice in such a way that step S15 is performed once more after a predetermined period of time has elapsed.

A method of controlling a deposition system while keeping the measuring time period at a constant value can omit step S16.

Although exemplary embodiments of the present invention have been shown and described, it would be appreciated by those skilled in the art that modifications can be made to these embodiment without departing from the principles and spirit of the present invention, the scope of which is defined by the appended claims.

As mentioned above, the deposition system and a method of controlling the deposition system according to an embodiment of the present invention, cancels noise measured in a deposition rate sensor using a noise canceller, thereby exactly controlling a deposition rate and obtaining a film of a desired thickness.

In addition, the deposition system and a method of controlling the deposition system according to an embodiment of the present invention, gradually increases a measuring time period or gradually reduces a power change unit, thereby increasing a convergence speed and reducing the influence of noise.

What is claimed is:

1. A deposition system, comprising:
   a deposition device;
   a deposition rate sensor to measure a deposition rate of the deposition device;
   a noise canceller to cancel a noise component of the measured deposition rate; and
   a power supply unit to adjust power supplied to the deposition device according to an output of the noise canceller, the noise canceller including a filter to vary bandwidth as a function of time.

2. The deposition system according to claim 1, wherein the deposition device is selected from the group consisting of an evaporator and a sputter.

3. The deposition system according to claim 1, wherein the filter comprises a low pass filter.

4. The deposition system according to claim 3, wherein the low pass filter is selected from the group consisting of an analog low pass filter, a digital low pass filter, and a processor including a program to execute a low pass filter operation.

5. The deposition system according to claim 3, wherein the low pass filter is adapted to reduce bandwidth according to passage of time.

6. The deposition system according to claim 3, wherein the low pass filter includes:
   a plurality of registers to sequentially shift the deposition rate measured by the deposition rate sensor according to a clock signal; and
   an adder to sum outputs of the register and to output the summed value as an output of the low pass filter.

7. The deposition system according to claim 3, wherein the low pass filter includes:
   a first multiplier to multiply an input thereof by a first coefficient;

an adder to sum the deposition rate measured by the deposition rate sensor and an output of the first multiplier and to output a summed result;

a register to delay and output an output of the adder to the input of the first multiplier according to a clock signal; and a second multiplier to multiply an output of the adder by a second coefficient.

8. The deposition system according to claim 1, wherein the power supply unit reduces the power supplied to the deposition device upon the output of the noise canceller being greater than a target deposition rate, and wherein the power supply unit increases the power supplied to the deposition device upon the output of the noise canceller being less than the target deposition rate.

9. A deposition system, comprising:
a deposition device;
a power supply unit to supply power to the deposition device;
a deposition rate sensor to measure a deposition rate of the deposition device; and
a noise canceller to control the power supply unit to change the power supplied to the deposition device according to a range of the measured deposition rate upon a deposition rate during a measuring time period and a deposition rate during a time period of the measuring time period equal to or greater than a predetermined percentage being in the same range.

10. The deposition system according to claim 9, wherein the noise canceller controls the power supply unit to cause the power supplied to the deposition device to be maintained at a previous value upon a deposition rate during a measuring time period and a deposition rate during a time period of the measuring time period greater than a predetermined percentage not being in the same range.

11. The deposition system according to claim 9, wherein the noise canceller cancels noise included in the deposition rate to obtain compensated deposition rate information, and to provides the compensated deposition rate information to the power supply unit to control the power supplied to the deposition device.

12. The deposition system according to claim 9, wherein the deposition device is selected from the group consisting of an evaporator and a sputter.

13. The deposition system according to claim 9, wherein the noise canceller controls the power supply unit to reduce the power supplied to the deposition device upon a range of the deposition rate being greater than a target deposition rate, and wherein the noise canceller controls the power supply unit to increase the power supplied to the deposition device upon the range of the deposition rate being less than the target deposition rate.

14. The deposition system according to claim 9, wherein the measuring time period is equal to or greater than one second.

15. The deposition system according to claim 9, wherein the noise canceller increases the measuring time period according to a passage of time.

16. The deposition system according to claim 9, wherein the noise canceller reduces a power change unit according to a passage of time.

17. A method of controlling a deposition system, the method comprising:
(a) measuring a deposition rate of a deposition device;
(b) determining whether a deposition rate during a measuring time period and a deposition rate during a time period of the measuring time period greater than a predetermined percentage are in the same range;
(c) changing the power supplied to the deposition device according to a range of the measured deposition rate upon the deposition rate during a measuring time period and the deposition rate during a time period of the measuring time period greater than a predetermined percentage being in the same range; and
(d) repeating steps (a) to (d).

18. The method according to claim 17, wherein, in step (c), a canceller controls the power supply unit to reduce the power supplied to the deposition device upon a range of the deposition rate being greater than a target deposition rate, and wherein the canceller controls the power supply unit to increase the power supplied to the deposition device upon the range of the deposition rate being less than the target deposition rate.

19. The method according to claim 17, wherein step (d) includes increasing the measuring time period after repeating steps (a) to (c) a predetermined number of times.

20. The method according to claim 17, wherein step (d) includes reducing a power change unit after repeating steps (a) to (c) a predetermined number of times.

* * * * *